US011244807B2

United States Patent
Motosugi

(10) Patent No.: US 11,244,807 B2
(45) Date of Patent: Feb. 8, 2022

(54) SETTLING TIME DETERMINATION METHOD AND MULTI CHARGED PARTICLE BEAM WRITING METHOD

(71) Applicant: NuFlare Technology, Inc., Yokohama (JP)

(72) Inventor: Tomoo Motosugi, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 17/102,551

(22) Filed: Nov. 24, 2020

(65) Prior Publication Data

US 2021/0193436 A1 Jun. 24, 2021

(30) Foreign Application Priority Data

Dec. 20, 2019 (JP) .............................. JP2019-230576

(51) Int. Cl.
| | |
|---|---|
| H01J 37/00 | (2006.01) |
| H01J 37/317 | (2006.01) |
| H01J 37/20 | (2006.01) |
| H01J 37/147 | (2006.01) |
| H01J 37/302 | (2006.01) |

(52) U.S. Cl.
CPC ........ *H01J 37/3177* (2013.01); *H01J 37/147* (2013.01); *H01J 37/20* (2013.01); *H01J 37/3026* (2013.01)

(58) Field of Classification Search
USPC .................................................. 250/492.22
See application file for complete search history.

(56) References Cited

U.S. PATENT DOCUMENTS

| | | | | |
|---|---|---|---|---|
| 5,404,018 A * | 4/1995 | Yasuda | .................. | B82Y 40/00 |
| | | | | 250/492.22 |
| 5,866,300 A * | 2/1999 | Satoh | ..................... | B82Y 40/00 |
| | | | | 430/296 |
| 7,417,233 B2 * | 8/2008 | Stovall | .................. | B82Y 10/00 |
| | | | | 250/396 ML |
| 7,893,411 B2 * | 2/2011 | Nishimura | ............. | B82Y 40/00 |
| | | | | 250/492.22 |
| 8,872,139 B2 * | 10/2014 | Nishimura | .......... | H01J 37/3174 |
| | | | | 250/492.22 |
| 9,147,553 B2 * | 9/2015 | Nishimura | .......... | H01J 37/3174 |

(Continued)

FOREIGN PATENT DOCUMENTS

| | | |
|---|---|---|
| JP | 2010-267842 A | 11/2010 |
| JP | 2013-058699 A | 3/2013 |

(Continued)

*Primary Examiner* — Phillip A Johnston
(74) *Attorney, Agent, or Firm* — Oblon, McClelland, Maier & Neustadt, L.L.P.

(57) ABSTRACT

In one embodiment, a settling time determination method includes deflecting a charged particle beam by applying a voltage outputted from an amplifier to a first deflector while changing a deflection settling time, and writing an evaluation pattern, measuring a position of the evaluation pattern, and determining a position displacement amount of the measured position from a design position, performing fitting of the position displacement amount for the deflection settling time on a first output waveform of the amplifier, and determining a deflection settling time in which the position displacement amount is within a predetermined range.

7 Claims, 6 Drawing Sheets

(56) References Cited

U.S. PATENT DOCUMENTS

| | | | |
|---|---|---|---|
| 9,377,374 B2* | 6/2016 | Brine | G05D 7/0629 |
| 10,126,717 B2* | 11/2018 | Tian | G05B 23/0297 |
| 10,325,756 B2* | 6/2019 | Platzgummer | G03F 1/78 |
| 2010/0288939 A1 | 11/2010 | Nishimura | |
| 2013/0065184 A1 | 3/2013 | Nishimura et al. | |
| 2014/0054469 A1 | 2/2014 | Nishimura | |
| 2016/0343535 A1 | 11/2016 | Matsui | |

FOREIGN PATENT DOCUMENTS

| | | |
|---|---|---|
| JP | 2014-041952 A | 3/2014 |
| JP | 2016-219577 A | 12/2016 |

* cited by examiner

SETTLING TIME DETERMINATION METHOD AND MULTI CHARGED PARTICLE BEAM WRITING METHOD

CROSS REFERENCE TO RELATED APPLICATION

This application is based upon and claims benefit of priority from the Japanese Patent Application No. 2019-230576, filed on Dec. 20, 2019, the entire contents of which are incorporated herein by reference.

FIELD

The present invention relates to a settling time determination method and a multi charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is written by using an electron beam writing apparatus, in which a technology commonly known as electron beam lithography is used.

An electron beam writing apparatus deflects an electron beam by applying a predetermined voltage to a main deflector and a sub-deflector disposed along the optical path of the electron beam, thereby writing a pattern on a substrate on a stage. When a deflector is driven by an output voltage from a digital-analog converter (DAC) amplifier, a settling time (stabilization time) of the output voltage according to a load is necessary. Here, when the settling time is insufficient, an error in the deflection movement amount of the electron beam occurs, and the writing accuracy is reduced. On the other hand, when the settling time is too long, the throughput is reduced. Therefore, it is desirable that the settling time be set to a short time as much as possible in a range in which the writing accuracy is not reduced.

Conventionally, multiple evaluation patterns are written while changing a main deflection settling time (a settling time set to the DAC amplifier which applies a voltage to the main deflector), a position displacement amount of each evaluation pattern is measured, and a settling time having a position displacement amount within a predetermined range is determined to be the optimal main deflection settling time.

For instance, the relationship between the position displacement amount and the main deflection settling time is as shown in FIG. 9. The main deflection settling time, which is the shortest among the main deflection settling times having a position displacement amount within a range between an upper limit threshold value and a lower limit threshold value, is set to the optimal main deflection settling time. For instance, when the position displacement amount of a main deflection settling time T1 is due to a variation, the optimal main deflection settling time is T2. However, when the position displacement amount of the main deflection settling time T1 is due to a settling error, the optimal main deflection settling time is T3.

Thus, in order to determine the optimal main deflection settling time, it is necessary to sufficiently exclude the effect of a variation in measurement results of the position displacement amount. However, in order to exclude the effect of a variation, it is necessary to write a great number of evaluation patterns while changing the main deflection settling time finely, thus causing a problem in that a tremendous amount of a writing time and a measurement time is taken.

In addition, in order to achieve a high writing accuracy, the settling error needs to be extremely small, and the cost is expensive because even after an optimal main deflection settling time is determined once, an evaluation pattern is written regularly, and an optimal main deflection settling time is newly determined from writing results.

DETAILED DESCRIPTION

In one embodiment, a settling time determination method includes deflecting a charged particle beam by applying a voltage outputted from an amplifier to a first deflector while changing a deflection settling time, and writing an evaluation pattern, measuring a position of the evaluation pattern, and determining a position displacement amount of the measured position from a design position, performing fitting of the position displacement amount for the deflection settling time on a first output waveform of the amplifier, and determining a deflection settling time in which the position displacement amount is within a predetermined range.

Hereinafter, an embodiment of the present invention will be described based on the drawings. In the present embodiment, a configuration using an electron beam will be described as an example of a charged particle beam. However, the charged particle beam is not limited to an electron beam, and may be an ion beam or the like.

Figure 1:
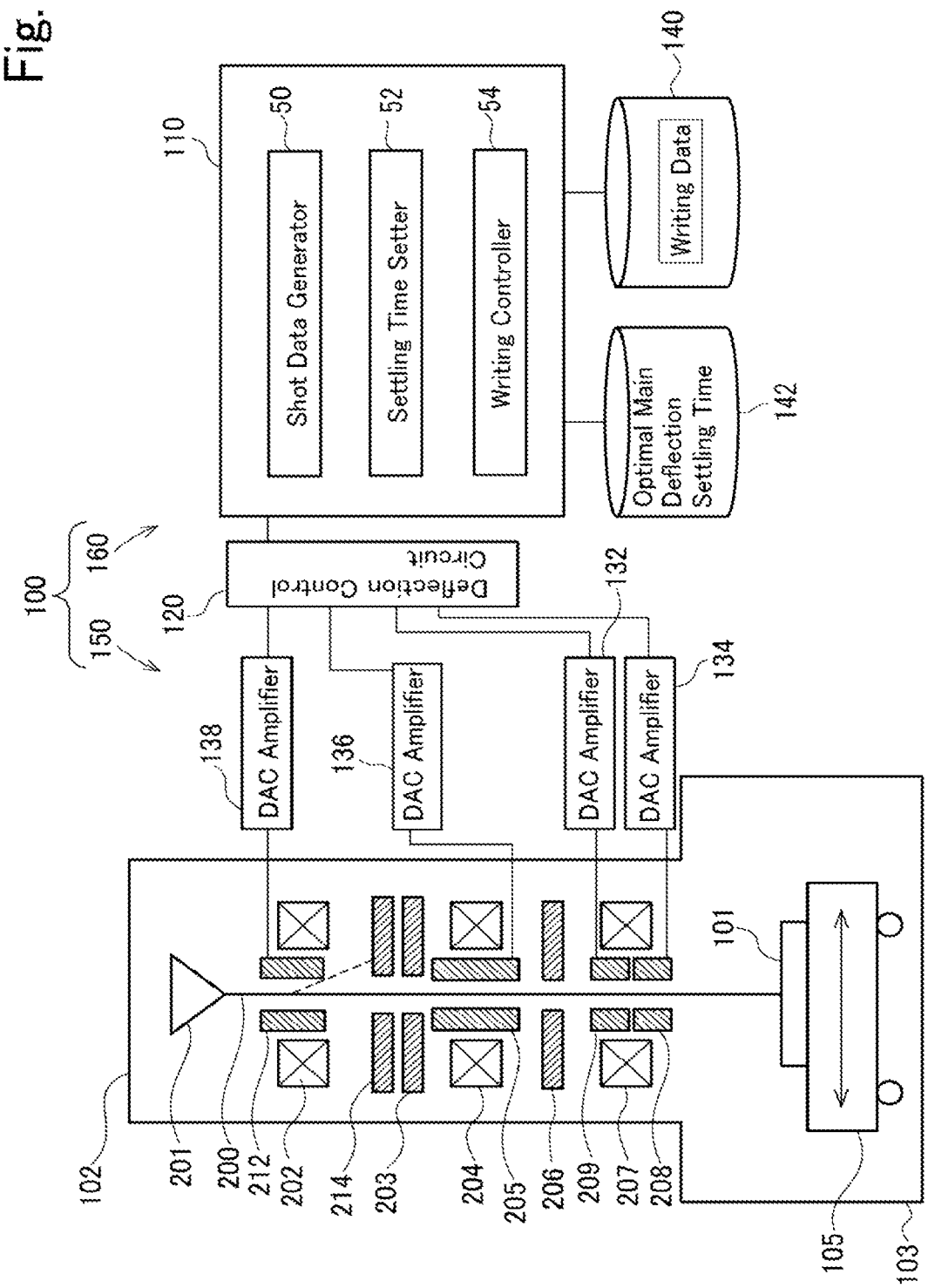
FIG. 1 is a schematic diagram of a charged particle beam writing apparatus according to an embodiment of the present invention.

FIG. 1 is a schematic configuration diagram of a writing apparatus according to an embodiment of the present invention. As shown in FIG. 1, the writing apparatus 100 includes a writer 150 and a controller 160. The writing apparatus 100 is an example of an electron beam writing apparatus. The writer 150 includes an electron column 102 and a writing chamber 103. In the electron column 102, an electron gun 201, an illuminating lens 202, a blanking deflector (blanker) 212, a blanking aperture 214, a first shaping aperture 203, a projection lens 204, a shaping deflector 205, a second shaping aperture 206, an objective lens 207, a main deflector 208 and a sub-deflector 209 are disposed. A sub-sub-deflector may be further provided below the main deflector 208.

In the writing chamber 103, an XY stage 105 movable in at least the XY directions is placed. On the XY stage 105, a substrate 101 is placed, which is a writing target. The substrate 101 is, for instance, a mask blank or a semiconductor substrate (silicon wafer).

When an electron beam 200 discharged from the electron gun 201 (discharger) passes through the blanking deflector 212, the electron beam 200 is controlled so as to pass through the blanking aperture 214 in a beam-ON state, and the entire beam is deflected so as to be blocked by the blanking aperture 214 in a beam-OFF state. The electron beam 200 which has passed through the blanking aperture 214 during a time from a beam-OFF state to a subsequent beam-OFF through a beam-ON provides the electron beam for a single shot.

The blanking deflector 212 controls the presence and absence of deflection of the passing electron beam 200 so as to generate a beam-ON state and a beam-OFF state alternately. The irradiation amount per shot of the electron beam 200 with which the substrate 101 is irradiated is adjusted by the irradiation time of each shot.

The electron beam 200 of each shot generated by passing through the blanking deflector 212 and the blanking aperture 214 illuminates the first shaping aperture 203 having rectangular holes by the illuminating lens 202.

The electron beam 200 in an aperture image which has passed through the first shaping aperture 203 is projected onto the second shaping aperture 206 by the projection lens 204. The aperture image on the second shaping aperture 206 is deflection-controlled by the shaping deflector 205, and its beam shape and size can be changed. Such variable shaping is performed per shot, and normally, the beam is shaped into beam shape and size which are different shot by shot.

The electron beam 200 which has passed through the second shaping aperture 206 is focused by the objective lens 207, deflected by the main deflector 208 and the sub-deflector 209, and is emitted to a desired position of the substrate 101 disposed on the XY stage 105 which is moved continuously. As described above, multiple shots of the electron beam 200 are deflected by each deflector onto the substrate 101 successively.

Figure 2:
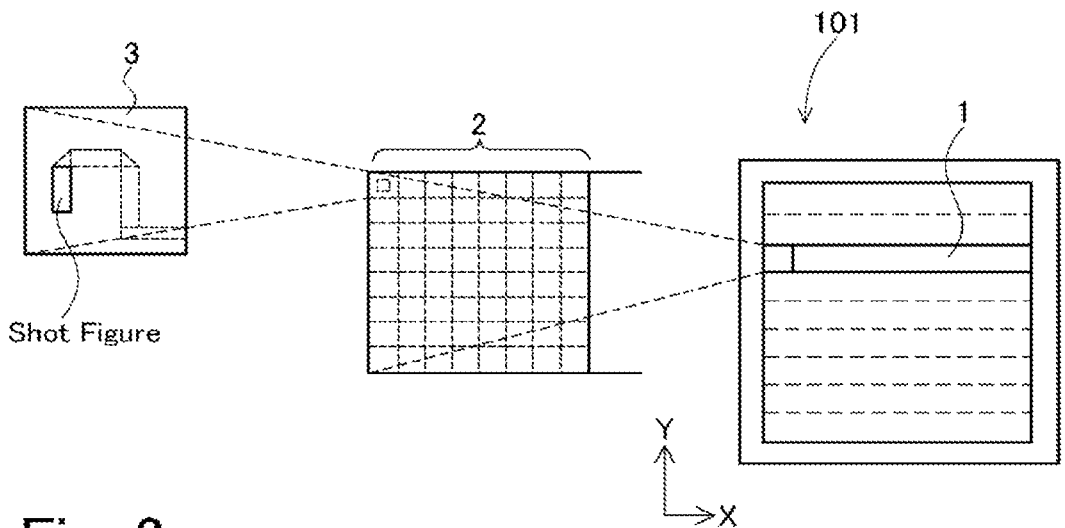
FIG. 2 is a conceptual view showing a main deflection area and a sub-deflection area.

FIG. 2 is a conceptual view showing a main deflection area and a sub-deflection area. As shown in FIG. 2, for instance, when a desired pattern is written by the writing apparatus 100 according to the step-and-repeat method, the writing area of the substrate 101 is divided into multiple strip-shaped writing areas 1 (strips 1), for instance, in the Y direction with a width deflectable by the main deflector 208. Then each strip 1 is also divided in the X direction with the same width as the width of the strip in the Y direction. The divided area is a main deflection area 2 which is deflectable by the main deflector 208. The area obtained by further finely dividing the main deflection area 2 is a sub-deflection area 3.

The sub-deflector 209 is used to control the position of the electron beam 200 per shot with high speed and high accuracy. Thus, the deflection range is limited to the sub-deflection area 3, and deflecton exceeding the area is performed by moving the position of the sub-deflection area 3 by the main deflector 208. In contrast, the main deflector 208 is used to control the position of the sub-deflection area 3, and is moved within the range (the main deflection area 2) including multiple sub-deflection areas 3. Also, since the XY stage 105 is continuously moved in the X direction during writing, movement of the XY stage 105 can be followed by moving (tracking) the writing origin of the sub-deflection area 3 as needed by the main deflector 208.

The controller 160 has a control computer 110, a deflection control circuit 120, a digital-analog conversion (DAC) amplifier units 132, 134, 136, 138, and storage devices 140, 142.

The control computer 110 includes a shot data generator 50, a settling time setter 52, and a writing controller 54. The functions of the shot data generator 50, the settling time setter 52, and the writing controller 54 may be comprised of software, or may be comprised of hardware. When comprised of software, a program which implements at least part of the function of the control computer 110 may be stored in a recording medium, and may be read and executed by a computer having a CPU.

The deflection control circuit 120 is connected to the DAC amplifier units 132, 134, 136, 138. The DAC amplifier unit 132 is connected to the sub-deflector 209. The DAC amplifier unit 134 is connected to the main deflector 208. The DAC amplifier unit 136 is connected to the shaping deflector 205. The DAC amplifier unit 138 is connected to the blanking deflector 212.

A digital signal for blanking control is outputted from the deflection control circuit 120 to the DAC amplifier 138. The DAC amplifier 138 converts the digital signal to an analog signal, and applies an amplified analog signal to the blanking deflector 212 as a deflection voltage. The deflection voltage causes the electron beam 200 to be deflected, and blanking control is performed on each shot.

A digital signal for shaping deflection is outputted from the deflection control circuit 120 to the DAC amplifier 136. The DAC amplifier 136 converts the digital signal to an analog signal, and applies an amplified analog signal to the shaping deflector 205 as a deflection voltage. The deflection voltage causes the electron beam 200 to be deflected to a specific position of the second shaping aperture 206, and an electron beam having desired size and shape is formed.

A digital signal for main deflection control is outputted from the deflection control circuit 120 to the DAC amplifier 134. The DAC amplifier 134 converts the digital signal to an analog signal, and applies an amplified analog signal to the main deflector 208 as a deflection voltage. The deflection voltage causes the electron beam 200 to be deflected, and the beam of each shot is deflected to the writing origin of the sub-deflection area 3. When writing is performed while the XY stage 105 is continuously moved, the deflection voltage also includes a deflection voltage for tracking to follow the stage movement.

A digital signal for sub-deflection control is outputted from the deflection control circuit 120 to the DAC amplifier 132. The DAC amplifier 132 converts the digital signal to an analog signal, and applies an amplified analog signal to the sub-deflector 209 as a deflection voltage. The deflection voltage causes the electron beam 200 to be deflected to a shot position within the sub-deflection area 3.

The storage devices 140, 142 are, for instance, a magnetic disk device or a semiconductor memory. The storage device 140 stores writing data for writing a pattern on the substrate 101. The writing data is such data that is converted from design data (layout data) to the format for the writing apparatus 100, and is inputted from an external device to the storage device 140, and is stored therein.

The storage device 142 stores an optimal main deflection settling time which has been determined by the later-described method.

The shot data generator 50 performs data conversion processing in multiple stages on the writing data stored in the storage device 140, divides each figure pattern as a writing target into shot figures in a size, each of which can be irradiated by a single shot, and generates shot data in a format specific to the writing apparatus. For each shot, the shot data includes, for instance, a figure code indicating a figure type of each shot figure, a figure size, a shot position, and an irradiation time. The generated shot data is temporarily stored in a memory (illustration is omitted).

The writing controller 54 transfers the shot data to the deflection control circuit 120. The deflection control circuit 120 outputs deflection data (blanking signal) to the DAC amplifier 138 for the blanking deflector 212, the deflection data providing the irradiation time set in the shot data.

The deflection control circuit 120 outputs deflection data (signal for shaping deflection) to the DAC amplifier unit 136, the deflection data providing the figure type and the figure size set in the shot data. In addition, the deflection control circuit 120 outputs deflection data to the DAC amplifier units 132, 134, the deflection data providing the shot position set in the shot data.

The settling time setter 52 retrieves an optimal main deflection settling time from the storage device 142, and notifies the deflection control circuit 120 of the optimal main deflection settling time. The deflection control circuit 120 outputs a signal to each DAC amplifier as needed so that the settling time for the main deflection becomes an optimal main deflection settling time. For instance, after outputting a signal for the main deflection to the DAC amplifier 134, the deflection control circuit 120 outputs a blanking signal to the DAC amplifier 138 so that beam-ON is achieved after lapse of the optimal main deflection settling time.

Figure 3:
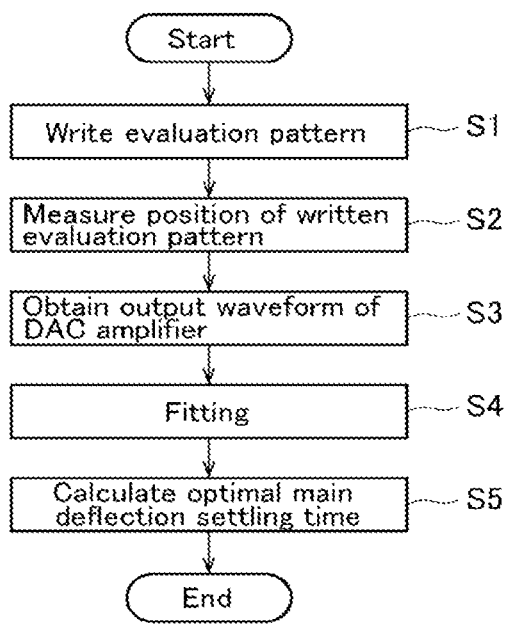
FIG. 3 is a flowchart illustrating a settling time determination method.

Next, a method of determining an optimal main deflection settling time will be described with reference to the flowchart shown in FIG. 3.

First, an evaluation pattern is written on a sample by changing the main deflection settling time, and moving the electron beam by the main deflector 208 (step S1). Multiple evaluation patterns with different main deflection settling times are written. Here, the deflection amount of the sub-deflector 209 is fixed to a predetermined value so that for instance, the center of the sub-deflection area 3 positioned by the main deflection is irradiated with the electron beam. Thus, position displacement of a pattern caused by the sub-deflection can be prevented. The XY stage 105 is stopped.

The position of the written evaluation pattern is measured by a publicly known position measuring instrument (illustration is omitted), and the amount of position displacement from a design position per main deflection settling time is determined (step S2).

Figure 6A:
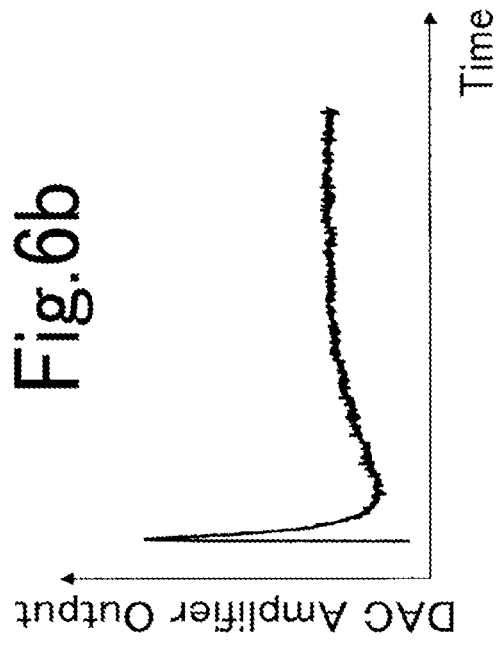
FIG. 6a is a graph illustrating measurement results of a position displacement amount.

For instance, any main deflection settling time is set, the electron beam is deflected by the main deflection to a first sub-deflection area adjacent in the y direction, and the evaluation pattern is written. Next, the electron beam is deflected by the main deflection with the same main deflection settling time from the first sub-deflection area to a second sub-deflection area adjacent in the y direction, and the evaluation pattern is written. In this manner, the electron beam is successively moved to the sub-deflection area adjacent in the y direction by the main deflection with the same main deflection settling time, and the evaluation pattern is written on each sub-deflection area. Then, the position of the evaluation pattern written on each sub-deflection area is measured, and the average value of the position displacement amounts is determined. For multiple main deflection settling times, the average value of such position displacement amounts is determined. When the position displacement amounts are plotted for the main deflection settling times, the relationship as shown in FIG. 6a is obtained.

Figure 6B:
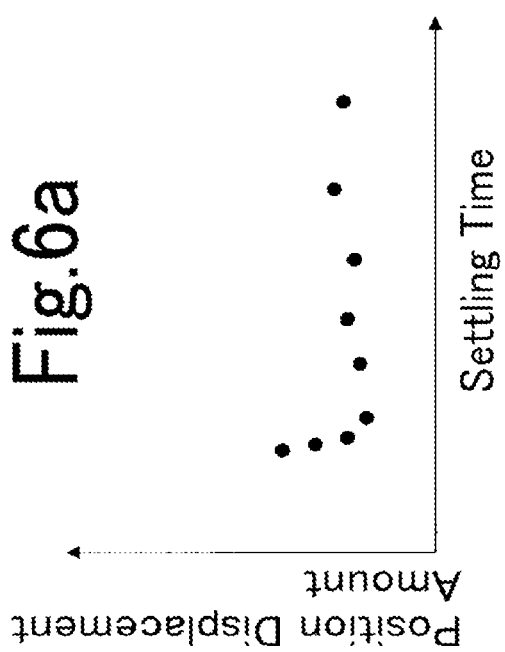
FIG. 6b is a graph illustrating an amplifier output waveform.

The output waveform of the DAC amplifier 134 which applies a voltage to the main deflector 208 is obtained (step S3). For instance, the amplifier output waveform is measured in advance before the DAC amplifier 134 is incorporated in the writing apparatus 100. The main deflector 208 has multiple electrodes (deflection plates), and the DAC amplifier 134 has multiple amplifiers that apply a voltage to respective electrodes. The output waveform obtained is a combined output waveform when those amplifiers involved in the movement of the electron beam among the multiple amplifiers perform output which simulates the deflection operation at the time of writing an evaluation pattern. FIG. 6b shows an example of a combined amplifier output waveform.

Figure 4:
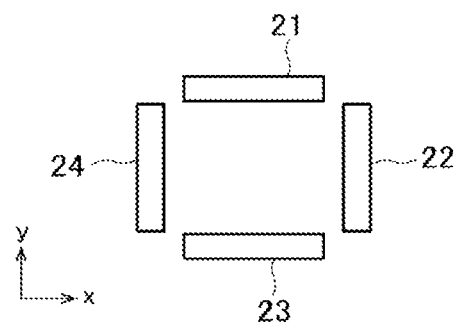
FIG. 4 is a view illustrating composition of amplifier output waveforms.

For instance, as shown in FIG. 4, the main deflector 208 has four electrodes 21 to 24. When the moving direction of the electron beam at the time of writing an evaluation pattern is the y direction, the output waveforms of the amplifiers which apply a voltage to the electrodes 21, 23 are combined. Let A21 be the output of the amplifier which applies a voltage to the electrode 21, and let A23 be the output of the amplifier which applies a voltage to the electrode 23, then the combined output waveform is obtained by the calculation of A23−A21.

Figure 5:
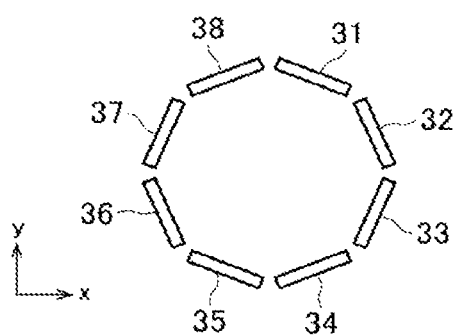
FIG. 5 is a view illustrating composition of amplifier output waveforms.

As shown in FIG. 5, the main deflector 208 has eight electrodes 31 to 38. When the moving direction of the electron beam at the time of writing an evaluation pattern is the y direction, the output waveforms of the amplifiers which apply a voltage to the electrodes 31, 34, 35, 38 are combined. Let A31, A34, A35, A38 be the respective outputs of the amplifiers which apply a voltage to the electrodes 31, 34, 35, 38, then the combined output waveform is obtained by the calculation of (A34+A35)/2−(A31+A38)/2.

Figure 6C:
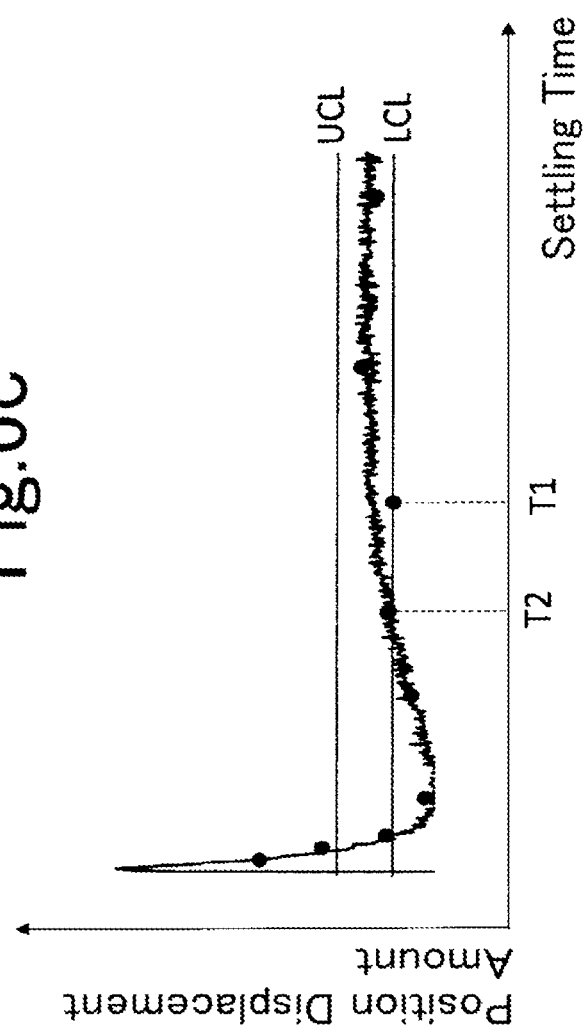
FIG. 6c is a graph illustrating a fitting example.

Next, fitting is performed on the position displacement amount per main deflection settling time obtained in step S2, and the amplifier output waveform obtained in step S3 (step S4). The position displacement amount per main deflection settling time and the amplifier output waveform are each plotted with respect to a time axis, thus are aligned by the fitting because time axes for both have a displacement. Also, the scales of the vertical axis (the position displacement amount and the amplifier output) are aligned by calculation. Fitting may be performed on the scales according to a situation. FIG. 6c shows an example in which fitting of the position displacement amount shown in FIG. 6a is performed on the amplifier output waveform shown in FIG. 6b.

Figure 10:
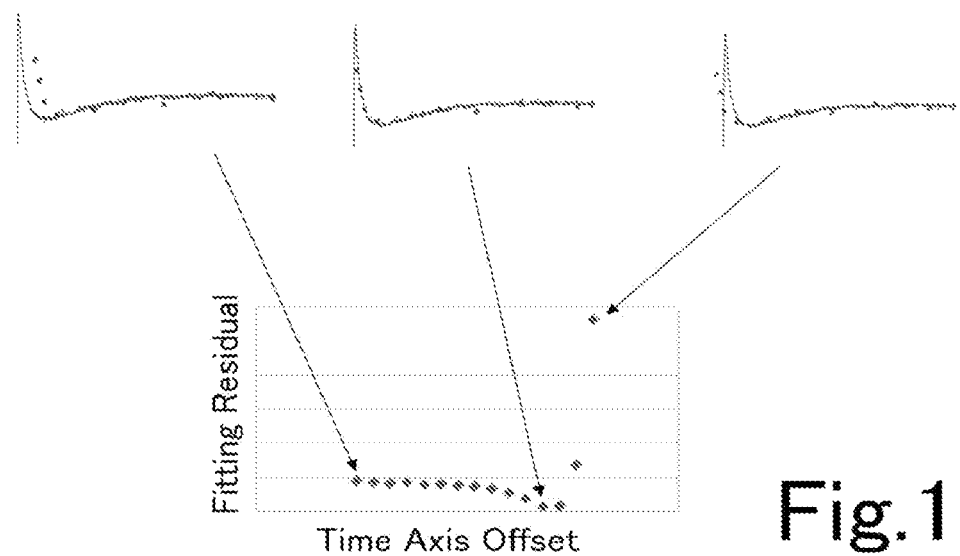
FIG. 10 is a graph illustrating a relationship between a time axis offset and a fitting residual.

Both the position displacement amount per main deflection settling time and the amplifier output waveform converge to zero. Thus, when fitting, it is only necessary to align the time axis (X axis). For example, as shown in FIG. 10, a fitting residual is calculated by superimposing the amplifier output waveform on the distribution of the position displacement amount while offsetting the time axis of the amplifier output waveform. The fitting residual can be the sum of squares of the difference between each point of the position displacement amount and the amplifier output waveform. The fitting residuals for each offset are plotted. When the optimum offset that minimizes the fitting residual is acquired, the fitting process is completed.

The offset that minimizes the fitting residual may be obtained by interpolation.

The smallest main deflection settling time, in which the position displacement amount stably falls within a predetermined range (the range between the lower limit threshold value LCL and the upper limit threshold value UCL), is calculated as an optimal main deflection settling time (step S5). For instance, in the example shown in FIG. 6c, the optimal main deflection settling time is T2. The calculated optimal main deflection settling time is stored in the storage device 142.

Figure 9:
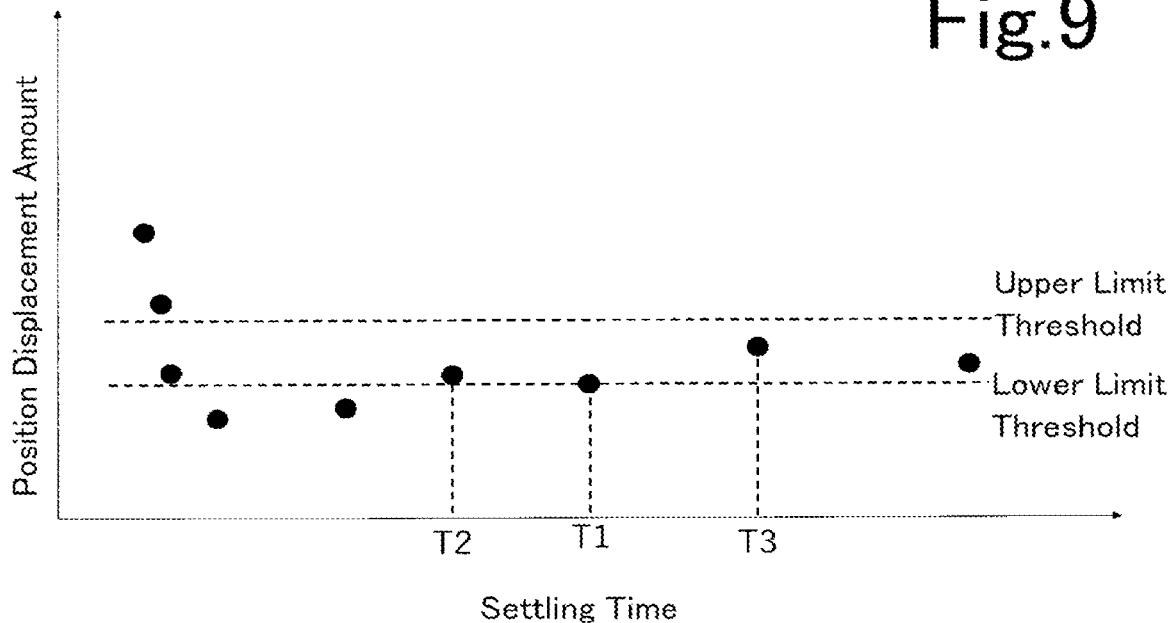
FIG. 9 is a graph illustrating an example of measurement results of the position displacement amount.

In the above-described example shown in FIG. 9, it is difficult to determine whether the position displacement amount of the main deflection settling time T1 is due to a settling error or a variation. However, in the present embodiment, it can be determined that the position displacement amount of the main deflection settling time T1 is due to a variation by performing fitting on the position displacement amount and the amplifier output waveform. Consequently, it is not necessary to write a great number of evaluation patterns while changing the main deflection settling time finely, thus the optimal main deflection settling time can be efficiently determined.

Figure 7:
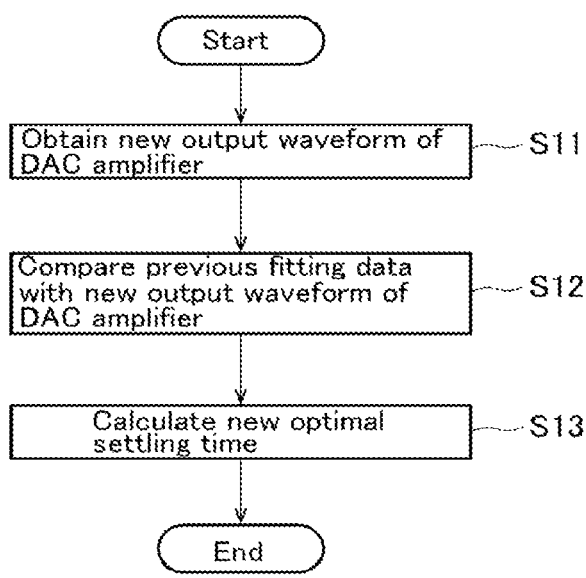
FIG. 7 is a flowchart illustrating a settling time determination method.

The optimal main deflection settling time is re-calculated and updated each time a predetermined time elapses. A method of updating the optimal main deflection settling time will be described with reference to the flowchart shown in FIG. 7.

The output waveform of the DAC amplifier is newly obtained (step S11). The output waveform obtained here is the output waveform of an amplifier corresponding to the moving direction of the electron beam when an evaluation pattern is written in step S1.

The fitting data in the previous time (the output waveform in the previous time) obtained in step S4 and a new output waveform (the output waveform in the current time) obtained in step S11 are overlaid and compared, and a new optimal main deflection settling time is calculated (step S12, S13).

Figure 8:
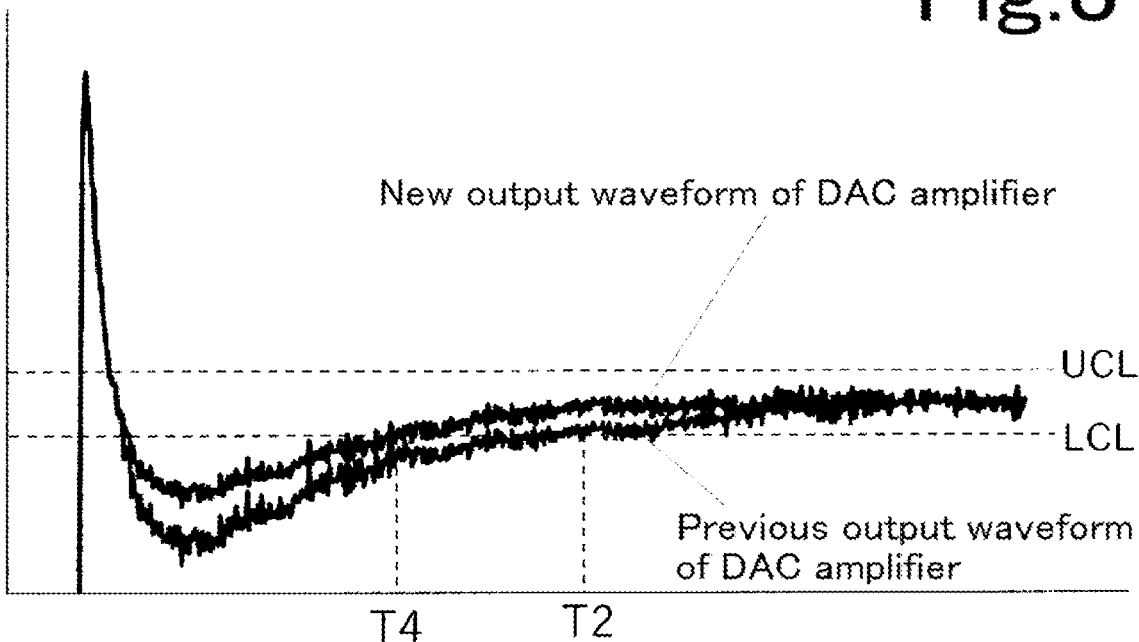
FIG. 8 is a graph illustrating an example of amplifier output waveforms.

FIG. 8 is a graph in which the output waveform in the previous time and the output waveform in the current time are overlaid with time axes aligned to each other. When the time at which the output falls below the lower limit threshold value LCL in the output waveform in the previous time is the optimal main deflection settling time T2 at the time of measurement in the previous time, T4 at which the output falls below the lower limit threshold value LCL in a new amplifier output waveform is calculated as a new optimal main deflection settling time. The new optimal main deflection settling time is stored in the storage device 142, and the optimal main deflection settling time is updated.

By performing fitting once on the position displacement amount of the evaluation pattern and the amplifier output waveform, when a new optimal main deflection settling time is calculated, the amplifier output waveforms only have to be compared, and the evaluation pattern does not need to be written again, thus an optimal main deflection settling time can be efficiently determined.

When the difference between a newly calculated optimal main deflection settling time and the optimal main deflection settling time calculated in the previous time is less than or equal to a predetermined value, the optimal main deflection settling time does not have to be changed.

In the present embodiment, an optimal settling time for the main deflection is determined, however, the invention can also be used to determine an optimal settling time of the sub-deflector which deflects an area smaller than that of the main deflector. In this case, an evaluation pattern only has to be successively written on a deflection area for the sub-sub-deflector, smaller than the sub-deflection area.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A settling time determination method comprising:
deflecting a charged particle beam by applying a voltage outputted from an amplifier to a first deflector while changing a deflection settling time, and writing an evaluation pattern;
measuring a position of the evaluation pattern, and determining a position displacement amount of the measured position from a design position;
performing fitting of the position displacement amount for the deflection settling time on a first output waveform of the amplifier, and determining a deflection settling time in which the position displacement amount is within a predetermined range.

2. The method according to claim 1,
wherein a second output waveform of the amplifier is newly obtained, and
time axes of the first output waveform on which the fitting of the position displacement amount for the deflection settling time is performed and the newly obtained second output waveform are aligned, and the deflection settling time is updated based on the second output waveform.

3. The method according to claim 1,
wherein the evaluation pattern is successively written on a deflection area which is adjacent in a predetermined direction and is for a second deflector that deflects in an area smaller than an area for the first deflector, and
when a plurality of amplifiers are provided, which apply a voltage to the first deflector to move the charged particle beam in the predetermined direction, fitting of the position displacement amount for the deflection settling time is performed on an output waveform in which output waveforms of the plurality of amplifiers are combined.

4. The method according to claim 2,
wherein the evaluation pattern is successively written on a deflection area which is adjacent in a predetermined direction and is for a second deflector that deflects in an area smaller than an area for the first deflector, and
when a plurality of amplifiers are provided, which apply a voltage to the first deflector to move the charged particle beam in the predetermined direction, fitting of the position displacement amount for the deflection settling time is performed on an output waveform in which output waveforms of the plurality of amplifiers are combined.

5. The method according to claim 3,
wherein when the evaluation pattern is written, a deflection amount of the second deflector is fixed to a predetermined value.

6. The method according to claim 5,
wherein the first deflector is a main deflector, and the second deflector is a sub-deflector,
the evaluation pattern is written on a center of each of a plurality of sub-deflection areas adjacent in a predetermined direction, and
a main deflection settling time when the evaluation pattern is written varies with the sub-deflection area.

7. A charged particle beam writing method in which a charged particle beam is deflected by a deflector, and a pattern is written on a substrate,
wherein writing processing is performed on the substrate using the deflection settling time determined by the settling time determination method according to claim 1.

* * * * *